(12) United States Patent
Saha

(10) Patent No.: US 6,344,405 B1
(45) Date of Patent: Feb. 5, 2002

(54) TRANSISTORS HAVING OPTIMIZED SOURCE-DRAIN STRUCTURES AND METHODS FOR MAKING THE SAME

(75) Inventor: Samar K. Saha, Milpitas, CA (US)

(73) Assignee: Philips Electronics North America Corp., New York, NY (US)

( * ) Notice: Subject to any disclaimer, the term of this patent is extended or adjusted under 35 U.S.C. 154(b) by 0 days.

(21) Appl. No.: 09/546,801

(22) Filed: Apr. 11, 2000

(51) Int. Cl.$^7$ .................. H01L 21/425; H01L 21/336
(52) U.S. Cl. .................. 438/514; 438/289; 438/306; 438/407; 438/528
(58) Field of Search .................. 438/514, 286, 438/289, 301, 306, 307, 528, 305, 407, 520, 247, 527; 257/336, 344, 408, 345, 409, 404

(56) References Cited

U.S. PATENT DOCUMENTS 5,675,166 A * 10/1997 Ilderem et al. .......... 257/345
5,937,293 A * 8/1999 Lee .......................... 438/247
6,114,211 A * 9/2000 Fulford et al. .......... 438/305

* cited by examiner

Primary Examiner—Matthew Smith
Assistant Examiner—Igwe U. Anya
(74) Attorney, Agent, or Firm—Martine & Penilla, LLP

(57) ABSTRACT

A transistor structure having dimensions below about 100 nm is provided. The transistor structure comprises a substrate with a first polarity. The substrate includes a shallow halo implant having the first polarity defined at a first depth within the substrate. The substrate also has a deep halo implant which is the same polarity as the substrate and is defined to a second depth deeper than the first depth of the shallow halo implant. The shallow halo implant and the deep halo implant allow a peak concentration of substrate impurities at a level below the gate such that the resistance of the transistor is minimized along with the threshold voltage, short channel effects and leakage current in the transistor.

26 Claims, 6 Drawing Sheets

TRANSISTORS HAVING OPTIMIZED SOURCE-DRAIN STRUCTURES AND METHODS FOR MAKING THE SAME

BACKGROUND OF THE INVENTION

1. Field of the Invention

The present invention relates to the manufacture of transistors in semiconductor substrates. More particularly, the present invention relates to a method of forming optimized source/drain doping profiles to improve performance in devices having reduced dimensions.

2. Description of the Related Art

Today's semiconductor devices are continually being pushed to meet stricter demands. As devices using this technology inundate the marketplace, consumers place higher demands on the devices. These demands include smaller, more compact devices with greater functionality.

Semiconductor devices employ various circuitry in a chip to perform user specified functions. As is well known, the circuitry consists of various metallization lines, dielectric layers and other components interconnected throughout the entire chip. The metallization lines and other components are connected to transistors located at a lower level of the semiconductor device. As is well known, the basic transistor has source and drain regions which are separated by a gate. By way of applying different voltages to the gate electrode, the transistor is either said to be ON or OFF.

Although there is a growing demand to scale transistor gate lengths to about 100 nm (i.e., 0.10 micron) and below for more demanding and compact digital circuit applications, such physical dimensions pose certain complications. For example, there is a need to cutoff leakage current in the OFF state, and to produce low resistance or high device current in the ON state. However, for small gate length devices, even in the OFF state, the space-charge region near the drain touches the source in a deeper place where the gate bias cannot control the potential, resulting in leakage current from the source to drain via the space-charge region. This is known as short-channel effect (SCE) which causes degradation in threshold voltage. As can be understood, for a transistor to work as a component of a digital circuit, the capability of switching OFF or the suppression of SCE is of high importance.

FIG. 1 illustrates a conventional transistor structure 22 formed in a substrate 10. The transistor structure 22 is shown having a gate electrode 16 and a gate oxide 18. In an effort to suppress SCE, deep source-drains (DSDs) 12 incorporating heavily doped shallow source-drain extensions (SDE) are formed. As shown, the SDEs are formed near the edges of a gate electrode 16. An additional channel doping called "pocket" is also implanted around the SDE regions. To achieve an acceptable OFF state (e.g., leakage current<10 nA/$\mu$m), pocket doping concentrations in excess of $4\times10^{18}$ cm$^{-3}$ is required. Such an extreme level of doping concentration in conjunction with high channel concentrations 24 (shown in FIG. 1) of about $1\times10^{18}$ cm$^{-3}$ used in sub-100 nm transistors (e.g., MOSFETs), causes a very high threshold voltage (Vth) resulting in high ON resistance, thus preventing the operation of the transistor at target supply voltages of about 1V or less. Thus, in the prior art, a trade off is made to reduce leakage currents by implementing high channel concentrations that necessarily require higher threshold voltages to turn ON the transistor.

Yet another problem with the manufacture of sub-100 nm transistors is the susceptibility to punch through. Punch through is generally understood to mean a case in which a dopant annealing process causes the source and drain depletion regions to come together. Since sub-100 nm transistors are pushing the limits on semiconductor manufacturing, transistor shorting or leakage due to punch through is a problem that needs to be addressed.

In view of the foregoing, there is a need for optimized source-drain regions for small transistors (e.g., in the range of 100 nm and below). The optimized source-drain regions should be configured to reduce the exposure of the transistor to leakage currents, and should be configured to reduce channel concentrations just below the gate in order to reduce channel resistance and the magnitude of the applied threshold voltage to successfully and rapidly turn ON the transistor. The optimized source-drain regions should also enable the manufacture of even shorter gate lengths while minimizing the likelihood of leakage currents, punch through, and excessive channel resistance.

SUMMARY OF THE INVENTION

Broadly speaking, the present invention fills these needs by providing an optimized transistor structure having dimensions in the range of about 100 nm and below. It should be appreciated that the present invention can be implemented in numerous ways, including as a process, an apparatus, a system, a device or a method. Several inventive embodiments of the present invention are described below.

In one embodiment, a method for forming transistor source/drain regions in a substrate is disclosed. The source/drain regions have a first polarity. A shallow halo region being of the first polarity and having a first concentration is implanted. A deep halo region also of the first polarity and having a second concentration that is lower than the first concentration is then implanted. The deep halo region is implanted deeper into the substrate than the shallow halo region.

In another embodiment, a transistor structure is disclosed. The transistor structure comprises a substrate having a first polarity. The substrate includes a shallow halo implant being of the first polarity and defined at a first depth within the substrate. The substrate also has a deep halo implant being of the first polarity and defined at a second depth that is greater than the first depth of the shallow halo implant.

In yet another embodiment, a transistor having source/drain regions in a substrate is disclosed. Each source/drain region comprises an extension implant region and a shallow halo implant region defined below the extension implant region. Each source/drain region also comprises a deep halo implant region defined below the shallow halo implant region and a deep implant region defined down to the deep halo implant region.

The many advantages of the present invention should be recognized. The present invention allows designers to design transistors with smaller dimensions. The new transistors avoid the problems of the prior art, namely, of leakage current, punch through and high ON resistance, while at the same time maintaining high threshold voltages as the gate lengths within transistors decrease.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

A transistor structure having optimized source-drain regions to improve functionality and performance in shrinking transistor dimensions and methods for making the optimized source-drain regions are disclosed. In a preferred embodiment, the shrinking transistors gate length sizes are in the range of about 100 nm and below. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
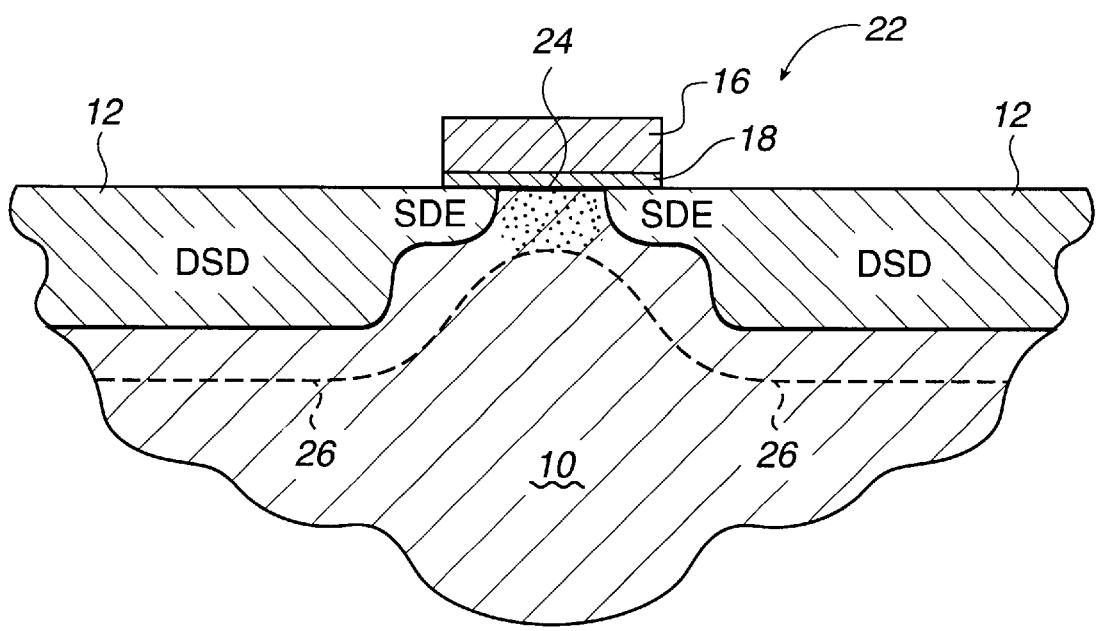
FIG. 1 shows a prior art transistor.
Figure 2:
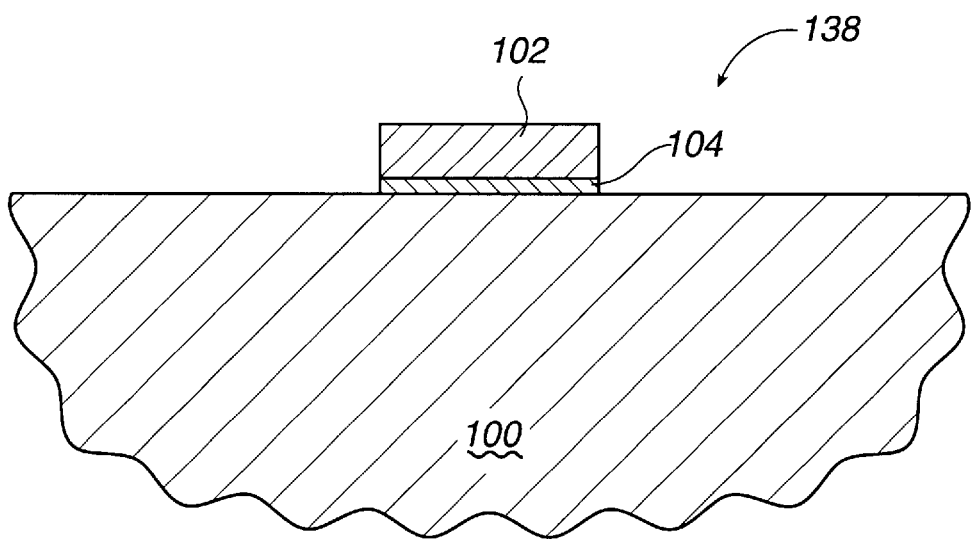
FIG. 2 illustrates one embodiment of the present invention showing the formation of a gate oxide and a gate oxide spacer for a transistor.

FIG. 2 illustrates the fabrication process of forming a transistor 138 which will have optimized source-drain regions, in accordance with one embodiment of the present invention. After the formation of well regions (p-type for NMOS, n-type for PMOS) using any number of techniques well known in the art, a gate 102 and a gate oxide 104 are formed onto a substrate 100 also using any number of techniques well known in the art. The gate 102 and the gate oxide 104 form a gate for the transistor 138. The transistor 138 is either an NMOS type transistor or a PMOS type transistor depending on the polarity of the substrate and the source-drain diffusion regions to be formed. In a preferred embodiment, the gate 102 is formed to a thickness of preferably between about 500 Å and about 3,000 Å, and more preferably about 1,000 Å. The gate 102 is formed to a length preferably between about 10 nm and about 100 nm, and more preferably between about 20 nm and about 80 nm, and most preferably about 40 nm. The gate oxide 104 is formed to a thickness between preferably about 5 Å and about 20 Å, and most preferably about 15 Å.

Figure 3A:
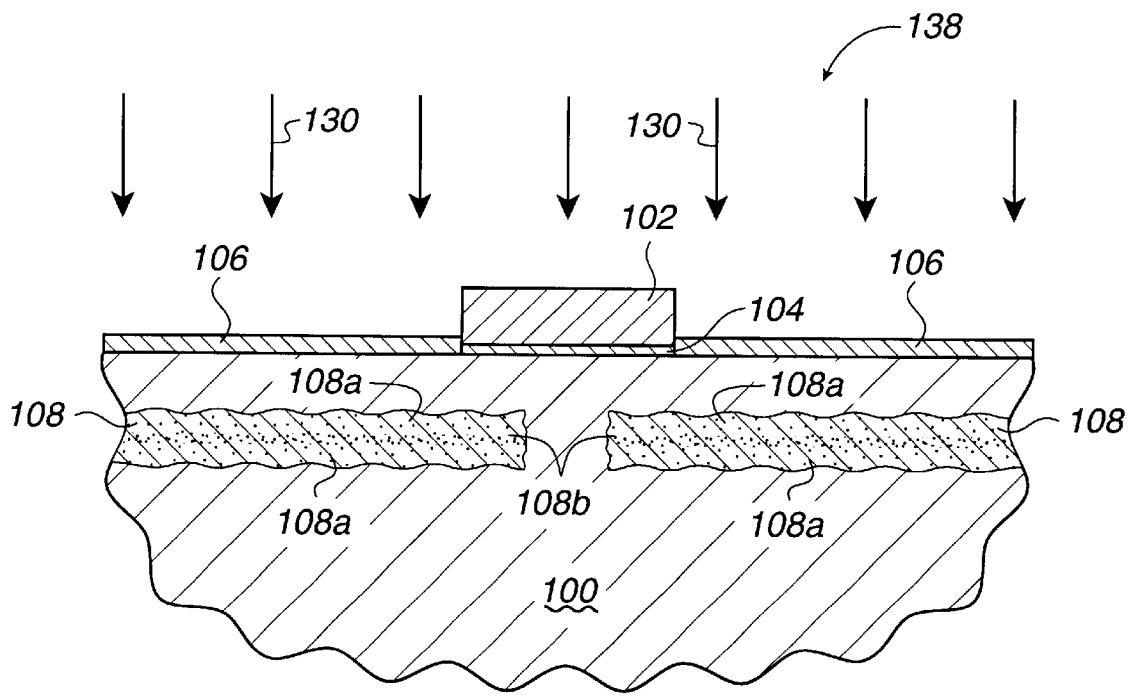
FIG. 3A is an embodiment of the present invention showing an impurity implantation operation forming a shallow halo implant into a substrate to form a transistor.

FIG. 3A is an embodiment of the present invention showing an impurity implantation operation 130 into the substrate 100 to define the source and drain regions. Initially, an oxide layer 106 is grown onto the surface of the substrate 100 using any number of techniques well known in the art. The grown oxide layer 106 is grown such that it forms a screen of oxide or a pad of oxide over the substrate 100. The grown oxide layer 106 preferably has a thickness of between about 10 Å and about 30 Å, and more preferably has a thickness of about 20 Å.

After the grown oxide layer 106 is formed over the surface of the substrate 100, a shallow halo implant 108 is defined within the substrate 100 by the impurity implantation operation 130. The shallow halo implant 108 is implanted to assist in suppressing the aforementioned leakage currents that are a result of short channel effect (SCE). As mentioned in the background, SCE can render a transistor non-functional if too much leakage current is present. The positioning of the shallow halo implant within the transistor at a depth that is apart from the surface of the substrate avoids creating high level concentrations (of the same polarity as the channel region) just below the gate in the channel region, which can lead to increased threshold voltages and increased channel resistance. As shown, the shallow halo implant 108 has a low concentration 108a region and a peak concentration 108b region.

The impurities used to form the shallow halo implant 108 vary depending on whether the transistor 138 is to be an NMOS type transistor or a PMOS type transistor. For an NMOS type transistor, the impurity of the halo is preferably a P-type impurity. To be clear, the halo (e.g., halo 108, and 112 shown in FIG. 5) impurity types will be of the same polarity as the substrate channel polarity. For an NMOS type transistor, the impurities implanted in the impurity implantation operation 130 are preferably impurities having low diffusion coefficients and more preferably Indium and most preferably Boron. During the impurity implantation operation 130 for an NMOS type transistor, the impurities are implanted at a peak concentration ranging preferably from about $1 \times 10^{18}$ atoms/cm$^3$ to about $1 \times 10^{19}$ atoms/cm$^3$ and more preferably about $4 \times 10^{18}$ atoms/cm$^3$. However, it should be noted that the concentration of the implant impurities differ from the actual concentration of the impurities in the shallow halo once the implant process is complete. The actual concentration varies from the concentration used in the impurity implantation operation 130 due to losses and the diffusion process as the impurities enter the substrate 100. For instance, the actual concentration should preferably range from about $1 \times 10^{18}$ atoms/cm$^3$ to about $5 \times 10^{18}$ atoms/cm$^3$ and more preferably about $2.5 \times 10^{18}$ atoms/cm$^3$.

For a PMOS type transistor, the implanted impurities are preferably impurities having low diffusion coefficients such as phosphorus (Ph), arsenic (As) and antimony (Sb), with antimony being the most preferred impurity. The impurities are implanted during the impurity implantation operation 130 for a PMOS type transistor at a peak implant concentration of preferably about $1 \times 10^{18}$ atoms/cm$^3$ to about $1 \times 10^{19}$ atoms/cm$^3$ and more preferably about $4 \times 10^{18}$ atoms/cm$^3$. Again, as with the NMOS impurities, the actual concentration within the transistor 138 differs from the concentration used during the impurity implantation operation 130. Here, the actual concentration in the substrate is preferably about $1\times10^{19}$ atoms/cm$^3$ to about $5\times10^{19}$ atoms/cm$^3$ and more preferably about $2.5\times10^{18}$ atoms/cm$^3$. During the impurity implantation operation 130, the energy used to implant the impurities into the substrate 100 is preferably between about 100 eV (electron volts) and about 1,000 eV, and more preferably about 300 eV. After the impurity implantation operation is performed, an etching operation (not shown) is performed to clean the surface of the substrate 100 along the grown oxide layer 106 and the gate 102. Any residue left over from the impurity implantation operation 130 is cleaned from the surface of the grown oxide layer 106 and the gate 102 during the etch operation.

Figure 3B:
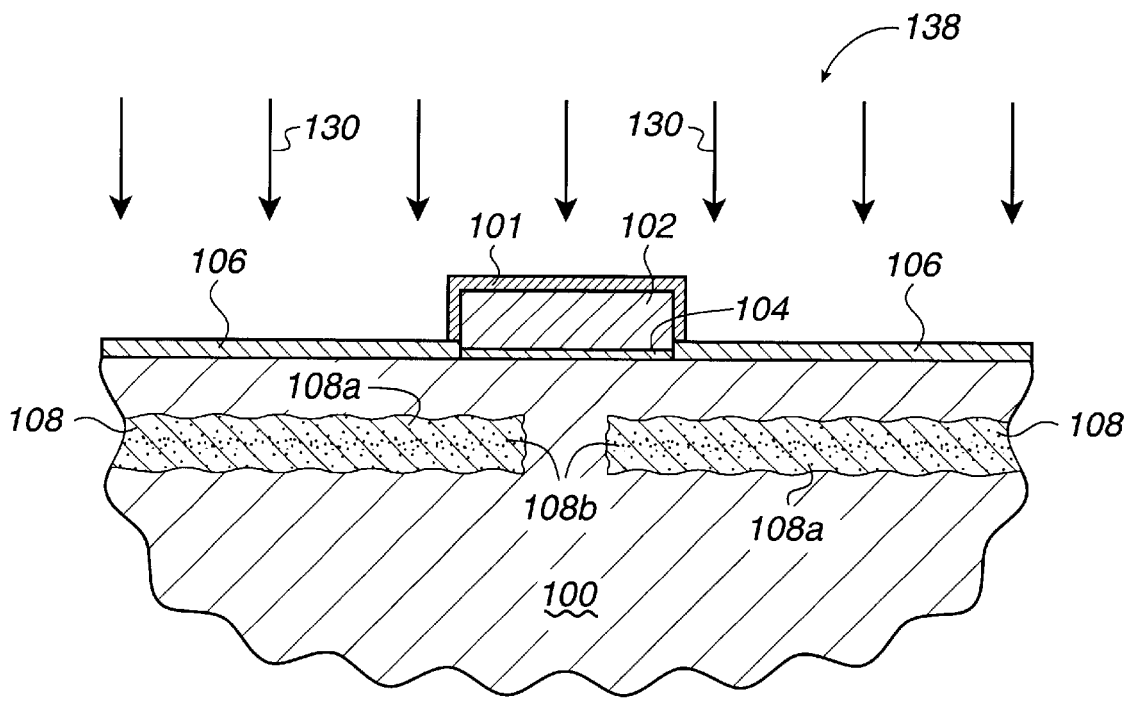
FIG. 3B is an alternative embodiment of the present invention illustrating an impurity implantation operation forming a shallow halo implant into a substrate to form a transistor.

FIG. 3B is an alternative embodiment illustrating the impurity implantation operation 130. In this embodiment, the gate 102 can be protected by a protective oxide layer 101 during the impurity implantation operation 130. The protective oxide layer 101 can be formed using many techniques, including chemical vapor deposition (CVD). The protective oxide layer 101 is deposited such that the gate 102 is covered by the protective oxide layer 101. Therefore, the gate 102 is protected from impurities implanted into the substrate 100 during the impurity implantation operation 130. It should be noted that the protective oxide layer 101 is optional and would be used while depositing n-type impurities in a PMOS transistor.

Figure 4:
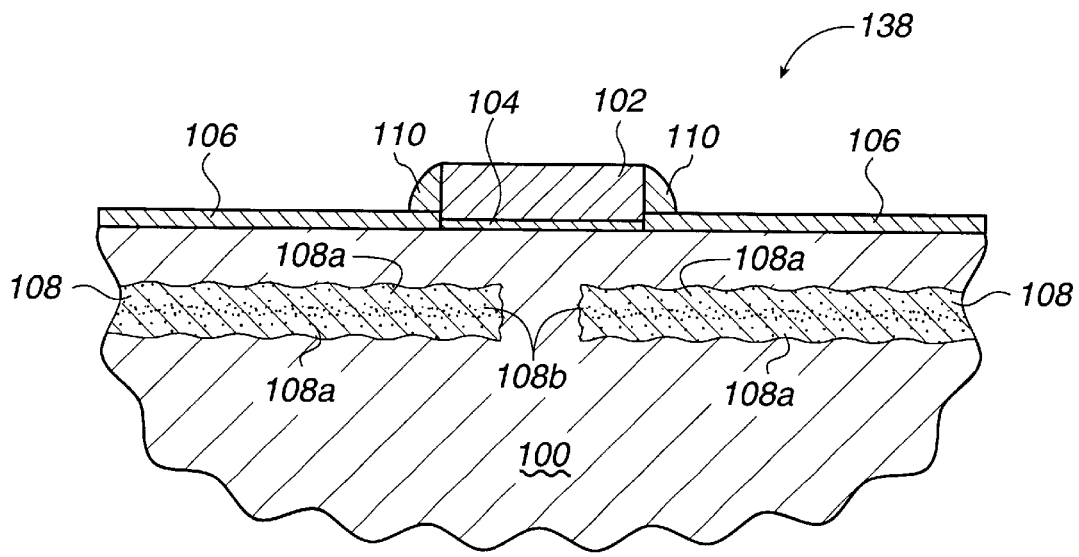
FIG. 4 shows the formation of offset spacers around a gate of a transistor in accordance with one embodiment of the present invention.

FIG. 4 is an embodiment of the present invention showing the formation of offset spacers 110 along the sides of the gate 102. The offset spacer may be formed using any number of deposition and etching techniques. The spacer is preferably made of oxide, although other materials can also be used, such as silicon nitride. The offset spacer is formed to a width ranging from preferably about zero nm (when no spacer is used) to about 20 nm, more preferably about 2 nm to about 10 nm, and most preferably about 5 nm. Thus, as can be ascertained from the preferable widths of the spacer, the offset spacer is optional. The offset spacer 110 is formed such that a deep halo implant, to be discussed with reference to FIG. 5, can be formed at an offset below the shallow halo implant 108.

Figure 5:
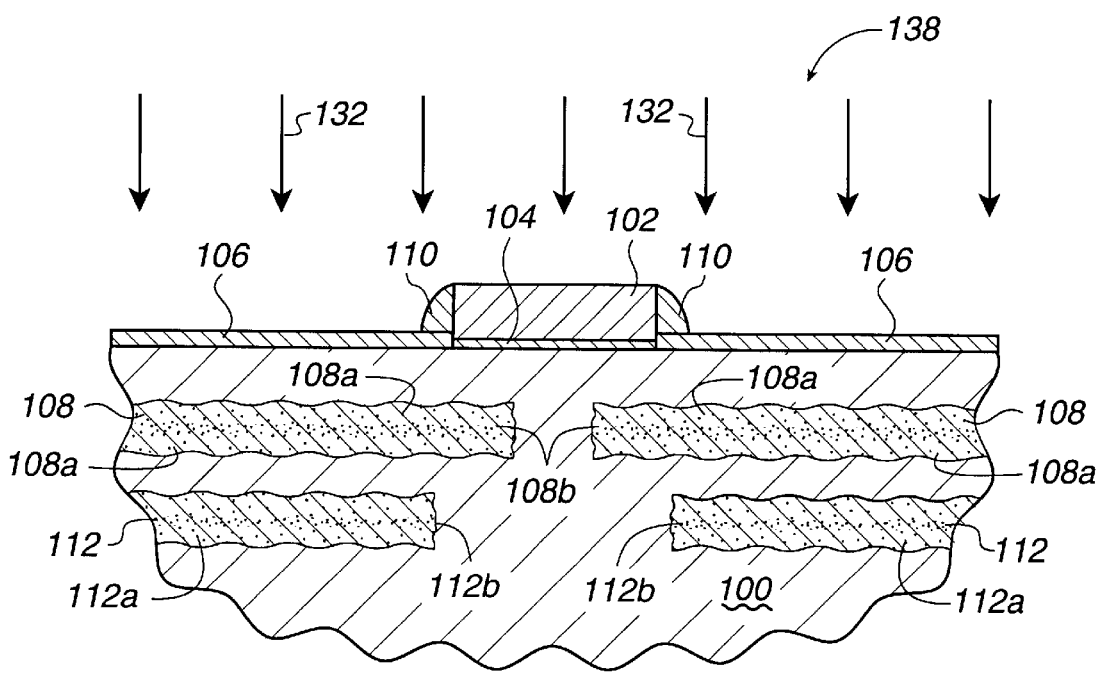
FIG. 5 depicts an embodiment of the present invention where an impurity implantation operation is performed to form a deep halo implant.

Now turning to FIG. 5, an impurity implantation operation 132 is shown forming a deep halo implant 112 in accordance with one embodiment of the present invention. The deep halo implant 112 is deeper within the substrate 100 below the shallow halo implant 108. As with the shallow halo implant 108, the type of impurities used to form the deep halo implant 112 depend on whether the transistor 138 is to be either an NMOS type transistor or a PMOS type transistor. Of course, the polarity of the halo implant impurities will be the same as the substrate channel. Thus, for an NMOS type transistor, the same type of P-type impurities used for the impurity implantation operation 130 may be used for the impurity implantation operation 132. In addition, the concentration ranges of the impurities implanted during the impurity implantation operation 132 are slightly lower than those of the halo implants 108. For example, the peak concentration can range between about $1\times10^{18}$ atoms/cm$^3$ and about $5\times10^{18}$ atoms/cm$^3$, and most preferably is about $2\times10^{18}$ atoms/cm$^3$. As discussed herein, the deep halo implants 112 can be referred to as lightly doped deep halo implants 112. The lightly doped deep halo implants 112 are preferably implanted to have a concentration between the shallow halo implants 108 and the deep source drain (DSD) implants 118, which will be described with reference to FIG. 8. The deep halo implants are preferably configured to further reduce the leakage from the deeper channel region where the gate bias cannot control the potential.

The energy used during the impurity implantation operation ranges from preferably about 500 eV to about 2,000 eV, and more preferably about 500 eV. As can be seen in FIG. 5, once the deep halo implants 112 are formed in the substrate 100, varying concentration levels are formed within the deep halo implant 112 as shown by low concentration areas 112a and peak concentration areas 112b. The impurity concentration level in the peak concentration area 112b is greater than the impurity concentration of the low concentration area 112a.

Figure 6:
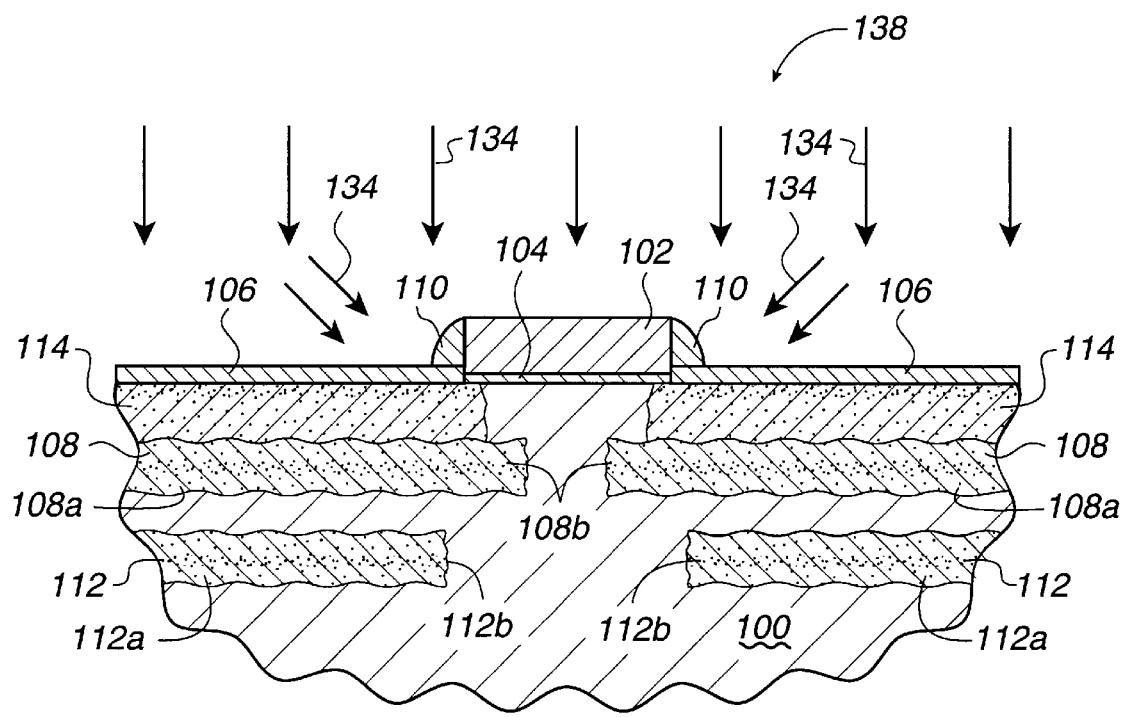
FIG. 6 shows an impurity implantation operation to form source/drain extensions in the substrate of a transistor, in accordance with one embodiment of the present invention.

FIG. 6 shows an impurity implantation operation 134 to form source/drain extensions (SDE) 114 in the substrate 100, in accordance with one embodiment of the present invention. Again, the impurities used to form the source/drain extensions 114 depend on whether the transistor 138 is either an NMOS type transistor or a PMOS type transistor. For NMOS type transistors, the impurity concentration used during the impurity implantation operation 134 is preferably about $1\times10^{20}$ atoms/cm$^3$ to about $5\times10^{20}$ atoms/cm$^3$ and more preferably about $3\times10^{20}$ atoms/cm$^3$. The type of impurities implanted for NMOS type transistors is preferably Arsenic (As) to form n+ regions. For PMOS type transistors, the concentration levels for the impurity implantation operation 134 are the same as those used for NMOS type transistors. The type of impurities used during the impurity implantation operation 134 for PMOS type transistors is preferably one of Boron and BF$_2$. It should now be noted that the polarity of the SDE 114 is opposite the substrate channel region. Although this is obvious for a standard transistor device, this is pointed out to contrast the polarity of the halo implants, which as described above is the same as the substrate.

The power used during the impurity implantation operation 134 to form the source/drain extensions 114 range preferably from about 200 eV to about 1,000 eV and more preferably about 300 eV. The impurity implantation operation 134 implants the source/drain extension 114 such that a portion of the source/drain extension forms underneath the offset spacer 110, and the gate 102. This may be done performing the impurity implantation operation 134 at an angle, as shown in FIG. 6. The source/drain extensions 114 are formed in the transistor 138 immediately above the shallow halo implant 108 to further suppress SCE. In addition, the source/drain extensions 114 is formed such that the peak concentration 108b of the shallow drain extension 108 is immediately above the source/drain extension 114. After the source/drain extension 114 are implanted, an etch operation (not shown) is performed to clean any residue left from the impurity implantation operation 134.

It should also be noted that an alternative way of creating the source/drain extension 114 is with solid source deposition. Solid source deposition is done by doping the transistor 138 with the impurities used to form the source/drain extension 114. After the transistor 138 is doped, an annealing operation is performed which causes the impurities to diffuse through the substrate 100.

Figure 7:
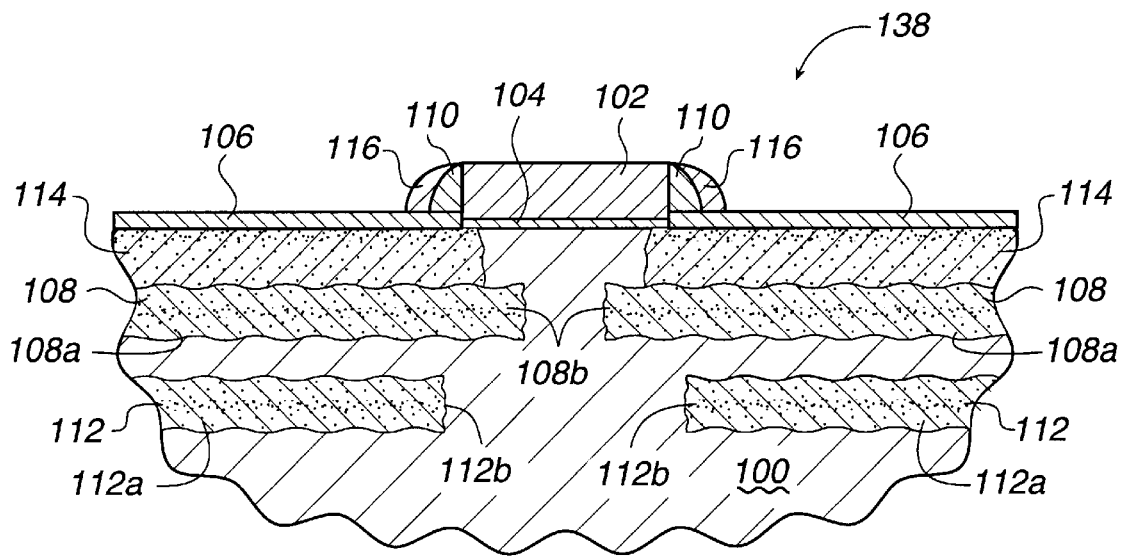
FIG. 7 shows the formation of a spacer in accordance with one embodiment of the present invention.

FIG. 7 shows the formation of another spacer 116 in accordance with one embodiment of the present invention. After residue from the impurity implantation operation 134 is cleaned from the substrate during an etch operation (not shown), the spacer 116 is formed. The spacer 116 is preferably defined from oxide or silicon nitride and is formed to a thickness ranging preferably from about 30 nm to about 100 nm and more preferably to about 50 nm. The spacer 116 is formed using blanket deposition and etch techniques. The spacer 116 facilitates the formation of a deep source/drain implant, as will be shown with reference to FIG. 8.

Figure 8:
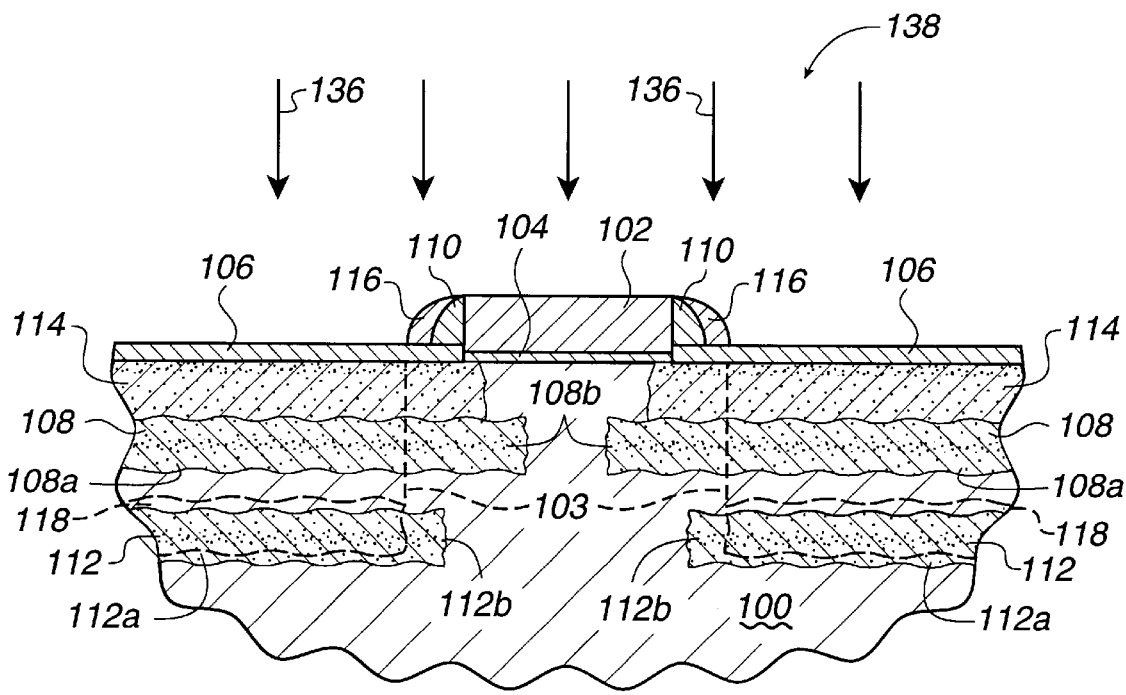
FIG. 8 shows an impurity implantation operation to form a deep/source drain of a transistor in accordance with one embodiment of the present invention.

FIG. 8 shows the formation of a deep source/drain implant 118 with an impurity implantation operation 136 in accordance with one embodiment of the present invention. For an NMOS type transistor, the impurities implanted are preferably Arsenic (As) or Phosphorus (Ph). The concentration of the impurities for an NMOS type transistor ranges from preferably about $1 \times 10^{20}$ atoms/cm$^3$ to about $5 \times 10^{20}$ atoms/cm$^3$ and more preferably about $3 \times 10^{20}$ atoms/cm$^3$. For a PMOS type transistor, the impurities used during the impurity implantation operation 136 are preferably Boron (B) or preferably Boron Flouride (BF$_2$). The impurities are implanted during the impurity implantation operation 136 at a range from preferably about $1 \times 10^{20}$ atoms/cm$^3$ to about $5 \times 10^{20}$ atoms/cm$^3$ and more preferably about $3 \times 10^{20}$ atoms/cm$^3$.

The energy used during the impurity implantation operation preferably ranges from about 500 eV to about 2000 eV, and more preferably about 500 eV. As will be shown with reference to FIG. 9, the impurities will diffuse through the substrate 100 to form the optimized source-drain wells that extends below the deep halo implant 112 after an annealing operation.

Figure 9:
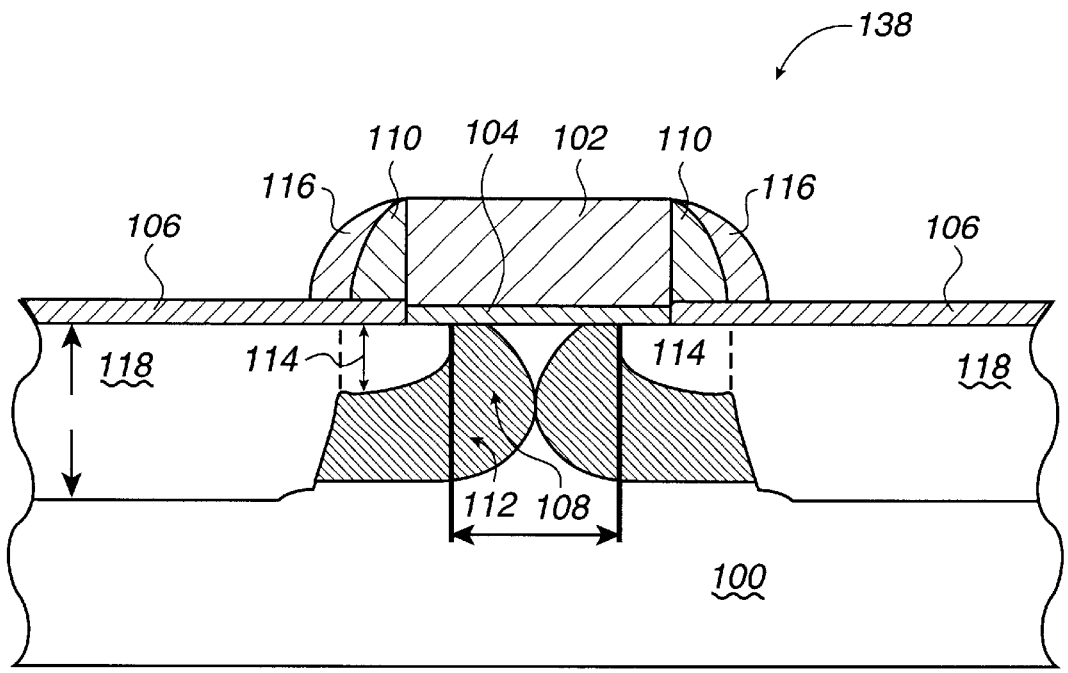
FIG. 9 shows an embodiment of the present invention after the transistor has been subjected to a rapid thermal anneal process.

FIG. 9 shows an embodiment of the present invention after the transistor 138 has been subjected to a rapid thermal anneal (RTA) process. The rapid thermal anneal process is done at a temperature ranging from preferably about 900° C. to about 1100° C., and more preferably about 950° C. The time for the rapid thermal anneal process ranges from preferably about 5 seconds to about 60 seconds and more preferably about 10 seconds. After the rapid thermal anneal operation is completed, the deep source/drain (DSD) region 118 is defined.

The deep source/drain region 118 is formed such that it extends from the surface of the substrate 110 down to below the deep halo implant 112. The deep source-drain region 118 forms wells 103 that are well known and define the transistor structure. Therefore, when gate 102 is turned ON with lower threshold voltages (Vth) in the range of about 1V, an inversion layer can be formed and current will flow from one deep/source drain region 118 to another deep/source drain region 118 with reduced resistance. After the rapid thermal anneal operation is completed, the concentration of the impurities implanted during the impurity implantation operations 130 and 132 concentrate to a level below the surface of the substrate 100 as shown with reference to FIG. 10.

Figure 10:
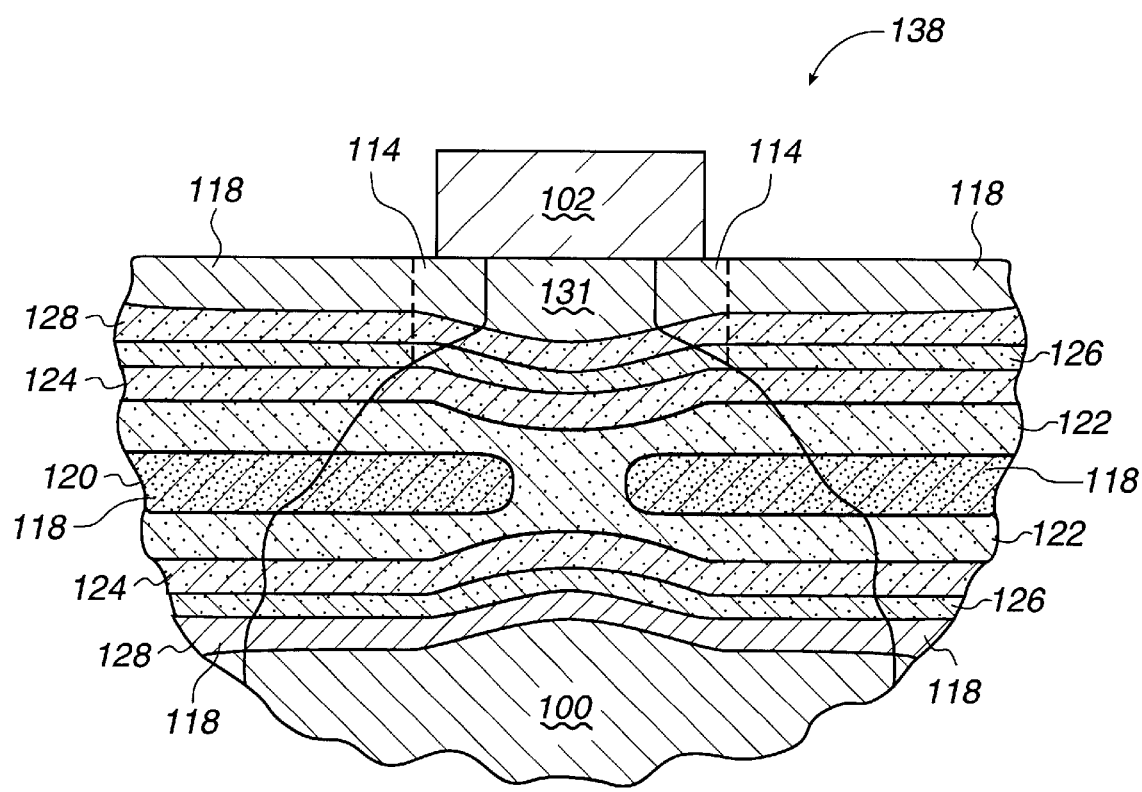
FIG. 10 shows concentration levels of impurities that are implanted during the impurity implantation operation after an annealing operation, in accordance with one embodiment of the present invention.

FIG. 10 shows a concentration profile of the transistor 138, which illustrates the varying levels of the impurities in the substrate 110. It should be noted that impurity concentration regions 120, 122, 124, 126 and 128 define concentration profiles that have the same polarity as the substrate (i.e., and opposite the polarity of the SDEs and DSDs). A peak concentration of impurities occurs at 120, thus forming an increased concentration level under the gate 102 to suppress SCE. However, as compared to the prior art, the peak concentration region is not immediately below the gate 102. This is especially beneficial since a lower impurity concentration region 131 will be defined below the gate 102 which assists in reducing the resistance in the ON state and also enables faster switching to the ON state with lower threshold voltages.

As can be pictorially seen, the concentration levels decrease closer to the surface of the substrate 100, and in particular, decrease with a curved profile just below the gate 102. More specifically, the impurity concentration level defined by the impurity concentration region 122 is less than the peak concentration region 120. The impurity concentration for the impurity concentration region 124 is less than the impurity concentration level for the impurity concentration region 122. The impurity concentration levels continue to decrease in the impurity concentration region 126 and decrease even further in the impurity concentration region 128 such that the impurity concentration of the region 128 is lower than that of the region 126 and the region 124.

As a result of the decreasing impurity concentration levels near the surface of the substrate and in particular under the channel region, the target threshold voltage of the transistor can be decreased. As such, the transistor 138 turns ON faster since the threshold voltage required to activate the gate 102 and the transistor 138 is lower. In addition, the peak concentration region 120 occurs just below the source/drain extension 114, thus still suppressing leakage currents due to short channel effects (SCEs).

As the gate lengths for the transistor 138 decrease, the peak concentration region 120 becomes more localized beneath the gate 102, yet leaving a lower concentration in the channel region proximate to the gate 102 and higher concentration in the location of the shallow halo 108.

As can be appreciated, the present invention provides many benefits to designers of high performance transistors (e.g., MOSFETs) that are challenging physical constraints associated with shrinking transistor dimensions. The embodiments of the present invention provide an optimized source-drain structure formed by a number of intelligently designed operations to enable the manufacture of transistor devices having gate lengths below about 100 nm (i.e., 0.10 micron). In the past, when users attempted to fabricate transistors having such dimensions, the aforementioned problems of leakage currents, punch through, and high ON resistance (e.g., source-drain series resistance) that degraded drive currents dissuaded such designs. Designers can now make smaller transistors with the optimized source-drain structures while at the same time reducing the threshold voltages to target levels of about 1V. For more information the formation of source-drain optimization, reference can be made to an article by inventor Samar Saha, entitled "*Drain Profile Engineering for MOSFET Devices with Channel Lengths below 100 nm,*" and published as part of SPIE Vol. 3881 (September 1999). This article is hereby incorporated by reference.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for forming transistor source/drain regions in a substrate having a first polarity, comprising:

implanting a shallow halo region being of the first polarity and having a first concentration; and implanting a deep halo region being of the first polarity and having a second concentration that is lower than the first concentration, the deep halo region being defined deeper into the substrate than the shallow halo region.

2. A method for forming transistor source/drain regions in a substrate having a first polarity as recited in claim 1, further comprising:

implanting a source-drain extension region into the substrate just above the shallow halo region, the shallow halo region being configured to assist in suppressing short channel effects, and the source-drain extension being of a second polarity that is opposite the first polarity.

3. A method for forming transistor source/drain regions in a substrate having a first polarity as recited in claim 2, further comprising:

implanting a deep source-drain region into the substrate to a depth that is about equal to a depth of the deep halo region, the deep halo region being configured to reduce deep leakage currents not controllable by a gate voltage potential, the deep source-drain region being of the second polarity that is opposite the first polarity.

4. A method for forming transistor source/drain regions in a substrate having a first polarity as recited in claim 3, further comprising:

forming a first transistor spacer before the implanting of the deep halo region.

5. A method for forming transistor source/drain regions in a substrate having a first polarity as recited in claim 3, wherein the implant of the deep source-drain region implements an implant concentration ranging between about $1\times10^{20}$ atoms/cm$^3$ to about $5\times10^{20}$ atoms/cm$^3$.

6. A method for forming transistor source/drain regions in a substrate having a first polarity as recited in claim 4, further comprising:

forming a second transistor spacer over the first transistor spacer before implanting the deep source-drain region into the substrate.

7. A method for forming transistor source/drain regions in a substrate having a first polarity as recited in claim 2, wherein the implant of the source drain extension region implements an implant concentration ranging between about $1\times10^{20}$ atoms/cm$^3$ and about $5\times10^{20}$ atoms/cm$^3$.

8. A method for forming transistor source/drain regions in a substrate having a first polarity as recited in claim 3, wherein a channel defined below a transistor gate separates the source/drain regions, the transistor gate having a gate length that is less than about 100 nm.

9. A method for forming transistor source/drain regions in a substrate having a first polarity as recited in claim 1, wherein the first concentration of the implanted shallow halo region ranges between about $1\times10^{18}$ atoms/cm$^3$ and about $1\times10^{19}$ atoms/cm$^3$.

10. A method for forming transistor source/drain regions in a substrate having a first polarity as recited in claim 1, wherein the second concentration of the implanted deep halo region ranges between about $1\times10^{18}$ atoms/cm$^3$ and about $5\times10^{18}$ atoms/cm$^3$.

11. A transistor structure, comprising:

a substrate being of a first polarity, the substrate including,
a shallow halo implant being of the first polarity and defined at a first depth within the substrate; and
a deep halo implant being of the first polarity and being defined to a second depth that is greater than the first depth of the shallow halo implant, the deep halo implant having a lower impurity concentration than an impurity concentration of the shallow halo implant.

12. A transistor structure as recited in claim 11, wherein the shallow halo implant has a higher impurity concentration than the substrate and the deep halo implant, and deep halo implant has a higher impurity concentration than the substrate.

13. A transistor structure as recited in claim 11, wherein the shallow halo implant is configured to assist in suppressing short channel effects.

14. A transistor structure as recited in claim 11, wherein the deep halo implant is configured to reduce leakage currents.

15. A transistor structure as recited in claim 11, further comprising:

source-drain extensions being of a second polarity that is opposite the first polarity and being defined in the substrate above and adjacent to the shallow halo implants.

16. A transistor structure as recited in claim 11, further comprising:

deep source-drains being of a second polarity that is opposite the first polarity and being defined in the substrate down to the deep halo implants.

17. A transistor structure as recited in claim 11, wherein the transistor structure includes a gate electrode, the gate electrode having spacers used to space apart the deep halo implants from a channel region of the transistor structure.

18. A transistor structure as recited in claim 17, wherein the gate electrode has a gate length that is less than or equal to about 100 nm.

19. A transistor structure as recited in claim 11, wherein the shallow halo implant has a concentration ranging between about $1\times10^{18}$ atoms/cm$^3$ and about $1\times10^{19}$ atoms/cm$^3$.

20. A transistor structure as recited in claim 11, wherein the deep halo implants have a concentration ranging between about $1\times10^{18}$ atoms/cm$^3$ and about $5\times10^{18}$ atoms/cm$^3$.

21. A transistor having source/drain regions in a substrate, each source/drain region comprising:

an extension implant region;
a shallow halo implant region defined below the extension implant region;
a deep halo implant region defined below the shallow halo implant region, the deep halo implant having a lower impurity concentration than an impurity concentration of the shallow halo implant; and
a deep implant region defined down to the deep halo implant region.

22. A transistor having source/drain regions in a substrate as recited in claim 21, wherein the substrate is of a first polarity and the shallow halo implant region and the deep halo implant region are also of the fist polarity.

23. A transistor having source/drain regions in a substrate as recited in claim 22, wherein the extension implant region and the deep implant region define each of the source/drain regions.

24. A transistor having source/drain regions in a substrate as recited in claim 22, wherein the shallow halo implant region is at a first depth in the source/drain region.

25. A transistor having source/drain regions in a substrate as recited in claim 24, wherein the deep halo implant region is at a depth lower than the first depth in the source/drain regions.

26. A transistor having source/drain regions in a substrate as recited in claim 24, wherein the extension implant region is at a depth above the first depth.

* * * * *